US009729116B2

(12) United States Patent
Lee (10) Patent No.: US 9,729,116 B2
(45) Date of Patent: Aug. 8, 2017

(54) ELECTRONIC DEVICE AND AUDIO OUTPUT CONTROL METHOD THEREOF

(71) Applicant: Samsung Electronics Co., Ltd., Suwon-si, Gyeonggi-do (KR)

(72) Inventor: Sungjin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 14/795,055

(22) Filed: Jul. 9, 2015

(65) Prior Publication Data
US 2016/0056782 A1 Feb. 25, 2016

(30) Foreign Application Priority Data
Aug. 21, 2014 (KR) ........................ 10-2014-0109064

(51) Int. Cl.
| | | |
|---|---|---|
| H03G 3/00 | (2006.01) | |
| H03G 3/20 | (2006.01) | |
| H04M 1/05 | (2006.01) | |
| H04M 1/60 | (2006.01) | |
| H04M 1/725 | (2006.01) | |
| H04R 5/04 | (2006.01) | |
| H04R 1/10 | (2006.01) | |
| H03G 3/10 | (2006.01) | |
| H03G 3/30 | (2006.01) | |

(52) U.S. Cl.
CPC ................. *H03G 3/20* (2013.01); *H03G 3/10* (2013.01); *H03G 3/3005* (2013.01); *H04M 1/05* (2013.01); *H04M 1/6058* (2013.01); *H04M 1/72527* (2013.01); *H04R 1/1041* (2013.01); *H04R 5/04* (2013.01); *H04R 2420/05* (2013.01); *H04R 2430/01* (2013.01)

(58) Field of Classification Search
CPC .... H04R 2430/01; H04R 1/1041; H04R 5/04; H04M 1/05; H04M 1/6058; H04M 1/72527; H03G 3/20
See application file for complete search history.

(56) References Cited

U.S. PATENT DOCUMENTS

| | | | |
|---|---|---|---|
| 8,654,993 B2 | 2/2014 | Lee et al. | |
| 2006/0147059 A1* | 7/2006 | Tang | ......................... H04R 5/04 381/104 |
| 2010/0111328 A1* | 5/2010 | Yu | ............................. H04R 5/04 381/107 |

(Continued)

FOREIGN PATENT DOCUMENTS

| | | |
|---|---|---|
| JP | 2005-33236 A | 2/2005 |
| JP | 2006-260649 A | 9/2006 |

(Continued)

*Primary Examiner* — Regina N Holder
(74) *Attorney, Agent, or Firm* — Jefferson IP Law, LLP (57) ABSTRACT

A method and an electronic device of controlling an audio output are disclosed. The method includes detecting an audio output device connected to an electronic device, determining a type of audio output device associated with the audio output device connected to the electronic device, determining a first audio output level associated with the audio output device connected to the electronic device based on the type of audio output device and a predetermined audio output level, and outputting an audio output at the first audio output level using the audio output device.

18 Claims, 6 Drawing Sheets

(56) References Cited

U.S. PATENT DOCUMENTS

| | | |
|---|---|---|
| 2011/0009058 A1 | 1/2011 | Ha et al. |
| 2011/0130853 A1* | 6/2011 | Han .................... H03G 3/3005 |
| | | 700/94 |
| 2013/0128119 A1 | 5/2013 | Madathodiyil et al. |
| 2014/0003616 A1 | 1/2014 | Johnson et al. |

FOREIGN PATENT DOCUMENTS

| | | |
|---|---|---|
| JP | 2011-250130 A | 12/2011 |
| KR | 100744345 B1 * | 7/2007 |
| KR | 10-2010-0068756 A | 6/2010 |

* cited by examiner

ELECTRONIC DEVICE AND AUDIO OUTPUT CONTROL METHOD THEREOF

CROSS-REFERENCE TO RELATED APPLICATION(S)

This application claims the benefit under 35 U.S.C. §119(a) of a Korean patent application filed on Aug. 21, 2014 in the Korean Intellectual Property Office and assigned serial number 10-2014-0109064, the entire disclosure of which is hereby incorporated by reference.

TECHNICAL FIELD

The present disclosure relates to an electronic device and an audio output control method thereof More particularly, the present disclosure relates to a method of controlling an audio output of an electronic device which automatically configures an audio output based on a use history for each audio output device in an electronic device which can output a sound through the audio output device.

BACKGROUND

An electronic device (e.g., a smart phone, a tablet, or other electronic device having an audio output) may output a sound through various wired and/or wireless audio output elements. For example, the audio output elements can include one or more of a wired earphone, an internal speaker, a BLUETOOTH headset, an external speaker, various wired/wireless audio output devices, etc.

Generally, the volume associated with the audio output elements has been controlled by an interaction with a user. For example, a user can control a volume control switch installed at an electronic device to increase or decrease the audio output level. Alternatively, the volume of the audio output element associated with the electronic device may be a control switch installed in a remote controller separate from the electronic device.

When an audio output is conventionally reproduced by an electronic device, the audio output is output at a preconfigured audio output level using an audio output element. However, the audio output may be perceived by a user differently based on the type of audio output element, the level of ambient noise present, and/or the type of audio content output using the audio output element (e.g., music, spoken word, etc.) such that a user may manually modify the audio output level to achieve a desired audio output level. For example, when a user is listening to music with wired earphones in an office or the like, it may be sufficient for the audio output level to be 3 (where the range of audio output levels can include, for example, 1-10 different levels where 1 is the lowest audio output level and 10 is the highest audio output level). In contrast, the audio output level may be required to be modified to about 10 in order to listen to the music with a BLUETOOTH headphone in an external space. Therefore, it is inconvenient for a user to manually modify the audio output level for each type of audio output element when listening to a type of audio content such as music.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device and method for allowing audio output levels to automatically be configured for each audio output device used with the electronic device. That is, the present disclosure is to provide a method for minimizing inconvenience associated with controlling volume for each audio output device.

In accordance with an aspect of the present disclosure, a method of controlling an audio output of an electronic device is provided. The method includes detecting an audio output device connected to an electronic device, determining a type of audio output device associated with the audio output device connected to the electronic device, determining a first audio output level associated with the audio output device connected to the electronic device based on the type of audio output device and a predetermined audio output level, and outputting an audio output at the first audio output level using the audio output device.

In accordance with another aspect of the present disclosure, an electronic device for outputting an audio to an audio output device among multiple audio output devices is provided. The electronic device includes an input unit configured to receive a selection associated with an audio output control mode and a recognition unit that detects an audio output device connected to the electronic device. The audio output device detected by the recognition unit that transmits the audio output from among a plurality of audio output devices. The electronic device further including a controller for generating first audio output information based on a type of the detected audio output device and a predetermined audio output level and for controlling the detected audio output device to transmit the audio output based on the generated audio output information. In addition, the electronic device also includes a storage device that stores the first audio output information.

Other aspect, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those or ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
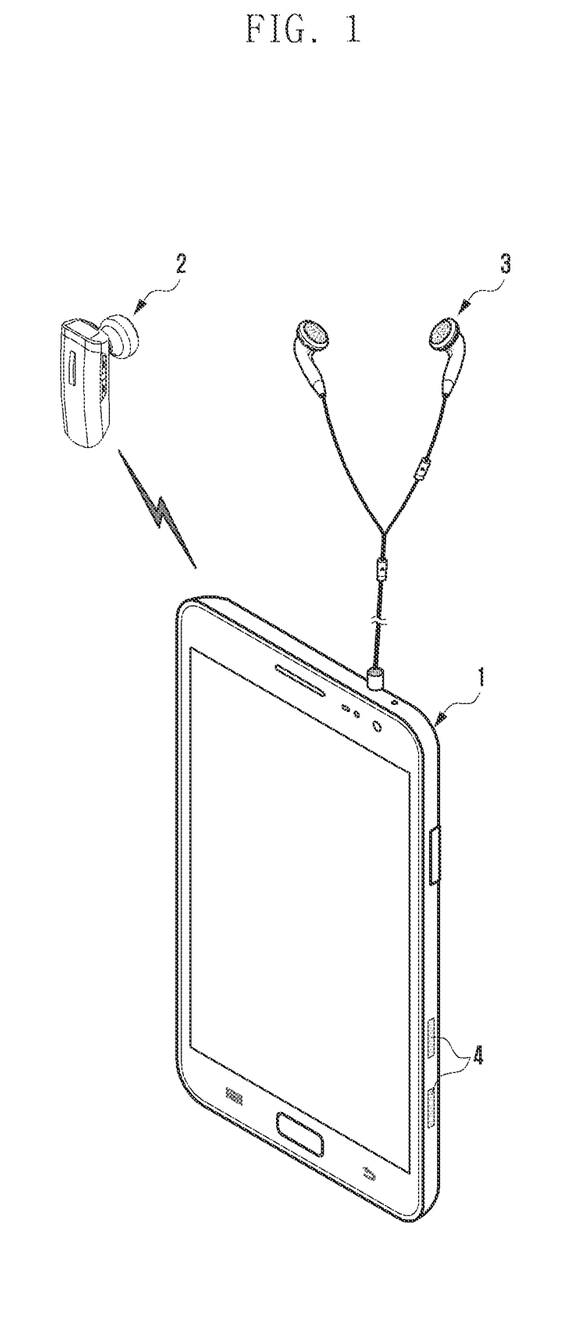
FIG. 1 is a view illustrating a use sate of an electronic device according to an embodiment of the present disclosure.

FIG. 1 is a view illustrating a use state of an electronic device according to an embodiment of the present disclosure.

Referring to FIG. 1, an electronic device according to an embodiment of the present disclosure may be wired or wirelessly connected to various audio output devices. For example, an electronic device 1 may be connected to various audio output devices such as a wired earphone 3, a BLUETOOTH headset 2 and an internal speaker 4. However, an electronic device generally outputs an audio output using one audio output device. For example, when the BLUETOOTH headset 2 or the wired earphone 3 has been connected to the electronic device, an audio output is output to the BLUETOOTH headset 2 or the wired earphone 3, respectively, where the audio output is not transmitted using the internal speaker 4.

In an exemplary embodiment, when a plurality of audio output devices are connected to the electronic device, a selection of desired audio output device to transmit the audio output may be based on a user selection.

Figure 2:
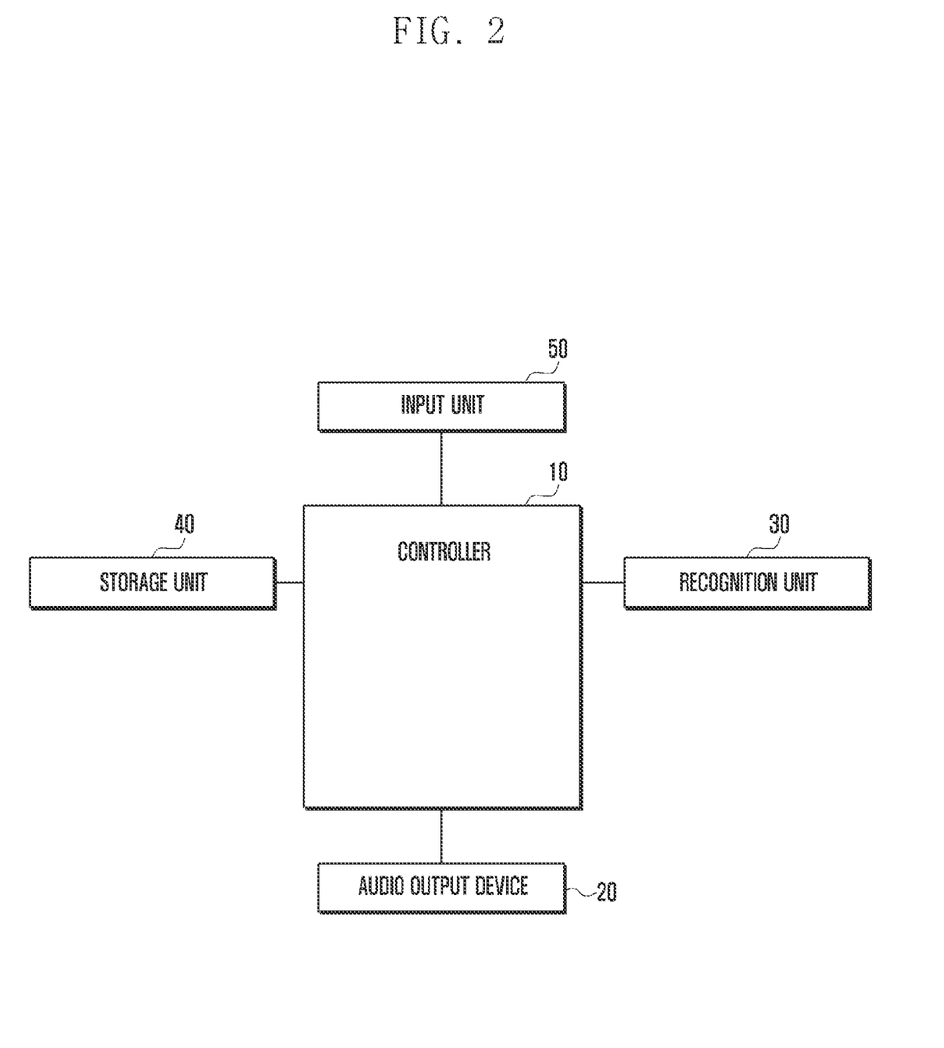
FIG. 2 is a block diagram schematically illustrating a configuration of an electronic device according to an embodiment of the present disclosure.

FIG. 2 is a block diagram schematically illustrating a configuration of an electronic device according to an embodiment of the present disclosure.

Referring to FIG. 2, an electronic device according to the embodiment of the present disclosure includes a controller 10, an audio output device 20, a recognition unit 30, a storage unit 40, and an input unit 50.

The audio output device 20 is a device configured to output or transmit an audio output generated by the electronic device. For example, the audio output can be a sound or other audio signal reproduced by the electronic device. While only one audio output device 20 is illustrated in FIG. 2, the audio output device 20 can include one or more audio output devices such as the internal speaker 4, the wired earphone 3 and the BLUETOOTH headset 2.

The recognition unit 30 is configured to recognize the audio output device 20 connected to the electronic device. In addition, the recognition unit 30 (or alternatively the controller 10) may be configured to identify a type of audio output device 20 from among a plurality of different audio output devices 20. An audio output is output or transmitted from the electronic device through the audio output device 20. The audio output device 20 in which the audio output is transmitted may be selected by a user or determined by a controller 10 based on the audio output devices 20 recognized by the recognition unit 30.

The input unit 50 is configured to receive an indication of a selection of an audio output control mode by the user. The audio output control mode may be classified into a manual mode and an automatic mode. In an exemplary embodiment, the manual mode corresponds to a mode in which an audio output level associated with the audio output device 20 is based on a predetermined audio output level and the automatic mode corresponds to a mode in which an audio output level associated with the audio output device 20 is automatically determined. For example, the automatic mode may be based on various factors associated with a pattern of use associated with a user.

The controller 10 is configured to combine or map a type of audio output device 20 used to communicate the audio output with an audio output level associated with the audio output device 20 and then generate audio output information.

The storage unit 40 is configured to store the audio output information generated by the controller 10 and transmits the audio output information to the controller 10 when there is a request from the controller 10 such that the audio output device 20 is controlled to output the audio output at an audio output level associated with the audio output information.

In an exemplary embodiment, the audio output information includes information associated with a type of audio output device 20 and audio output level associated with the type of the audio output device 20. The audio output information may include a combination of alphanumeric symbols. However, one of ordinary skill in the art would recognize that the audio output information may have any format that includes information associated with a type of audio output device and an audio output level. In addition, the audio output information can further include information associated with a type of content corresponding to the audio output such as music, spoken word, etc.

When the audio output information is a combination of alphanumeric symbols, the type of the audio output device 20 may be characterized by a letter (alphabet) and the audio output level may be characterized by a number. For example, when there are five different audio output devices 20, each audio output device may be assigned a letter such as A, B, C, D, E. The audio output levels may correlate to different levels such as in the range of 0 to 20 where 0 is the lowest audio output level and 20 is the highest output level. While a range of 0 to 20 is described, one of ordinary skill would recognize that any number of levels may be used. In an exemplary embodiment, when an audio output level of a first audio output device (A) is 13, audio output information may be defined as A13. When an audio output level of a third audio output device (C) is 8, audio output information may be defined as C08. The number of the audio output devices 20, the audio output levels, and the type of the audio output information are examples and may variously be changed.

Information associated with the types of audio output devices 20, the audio output levels, and/or the audio output information may be stored in the storage unit 40 in various ways. For example, the information associated with the types of audio output devices 20, the audio output levels, and/or the audio output information may be stored in a look-up table. In an exemplary embodiment, various audio output levels may be mapped to each audio output device.

The controller 10 may be further configured to determine an average value of the audio output levels stored in the storage unit 40 and then may control an audio output level of an audio output device 20 to output the audio output based on the determined average value of the audio output levels. That is, the level in which an audio output is transmitted by the audio output device associated with the electronic device may be controlled based on the average value of the audio output levels.

In an exemplary embodiment, multiple audio output information entries associated with a single audio output device are stored in the storage unit 40. A predetermined number of the multiple audio output information entries associated with the single audio output device are averaged together and the controller controls the audio output device to transmit the audio output at the average audio output level value.

For example, when an audio output has been output be an audio output device A associated with the electronic device, the controller 10 selects audio output information beginning with A and then calculates an average value from a plurality of audio output levels. In addition, the controller 10 controls an audio output of the audio output device A based on the calculated average value. The controller 10 may control the audio output level of the audio output device 20 to be an audio output level identical to the audio output calculated by the average value or the controller 10 may control the audio output to be an audio output level substantially similar to the average value.

Multiple entries associated with the audio output information are stored in the storage unit 40. The audio output information may be repeatedly stored in order to control the audio output level based on a pattern correlating to a use of the audio output device 20. However, when the audio output information is accumulated and then stored, an average value of the audio output level calculated by the audio output information may be close to a constant value. For example, even though the pattern of use may be modified, the resulting audio output level calculated by the average value may not be changed. Thus, in an exemplary embodiment, the number of entries associated with the audio output information used to calculate an average value may be selected such that the average value is not a constant value. Further, it is preferable to select audio output information close to a time point in which an audio output has begun to be outputted by the audio output device. It is assumed that although the number of the entries of the audio output information for calculating the average value is not limited, an average value is determined from five entries of the audio output information for convenience of the description.

When an audio output has been output during a predetermined time and then the audio output is interrupted, that is, there is no reproduction or transmission of an audio file during the predetermined time, the controller 10 generates audio output information by combining a character for a type of the audio output device 20 through which an audio output has been progressed and an audio output level associated with the audio output device 20 and stores the audio output information in the storage unit 40.

When the audio output of the electronic device has been transmitted to the audio output device 20, the controller 10 selects five entries of audio output information close to a start time point and then calculates an average value associated with the audio output information.

The five entries of audio output information close to the output time point may correspond to audio output information related to a single audio output device 20 which outputs a sound. Alternatively, the five entries of audio output information may be selected among audio output information associated with a plurality of different types of audio output devices. For example, the five entries may be associated with the same audio content transmitted using a plurality of different types of audio output devices such as BLUETOOTH headset 2 and the wired earphones 3.

When an audio output has been output using an audio output device A of the electronic device, five entries of audio output information associated with audio output device A are determined based on a plurality of audio output levels detected at a time point close to a time point at which the audio output has begun to be output.

That is, a user determines an audio output level of the output device A according to an audio output level use pattern associated with the output device A. For example, when the average audio output level has been determined to be about 12 for a device B and the average audio output level has been determined to be about 8 for the device A, when the user selects that the audio output is to be output using the audio output device A, the output device A outputs the audio output at a level of 8.

FIGS. 3-6 illustrate flow charts of exemplary method of controlling an audio output of an electronic device. The methods will be discussed with reference to the exemplary electronic device 1 illustrated in FIGS. 1 and 2. However, the methods can be implemented with any suitable electronic device. In addition, although FIGS. 3-6 depict steps performed in a particular order for purposes of illustration and discussion, the methods discussed herein are not limited to any particular order or arrangement. One skilled in the art, using the disclosures provided herein, will appreciate that various steps of the methods can be omitted, rearranged, combined, and/or adapted in various ways.

Figure 3:
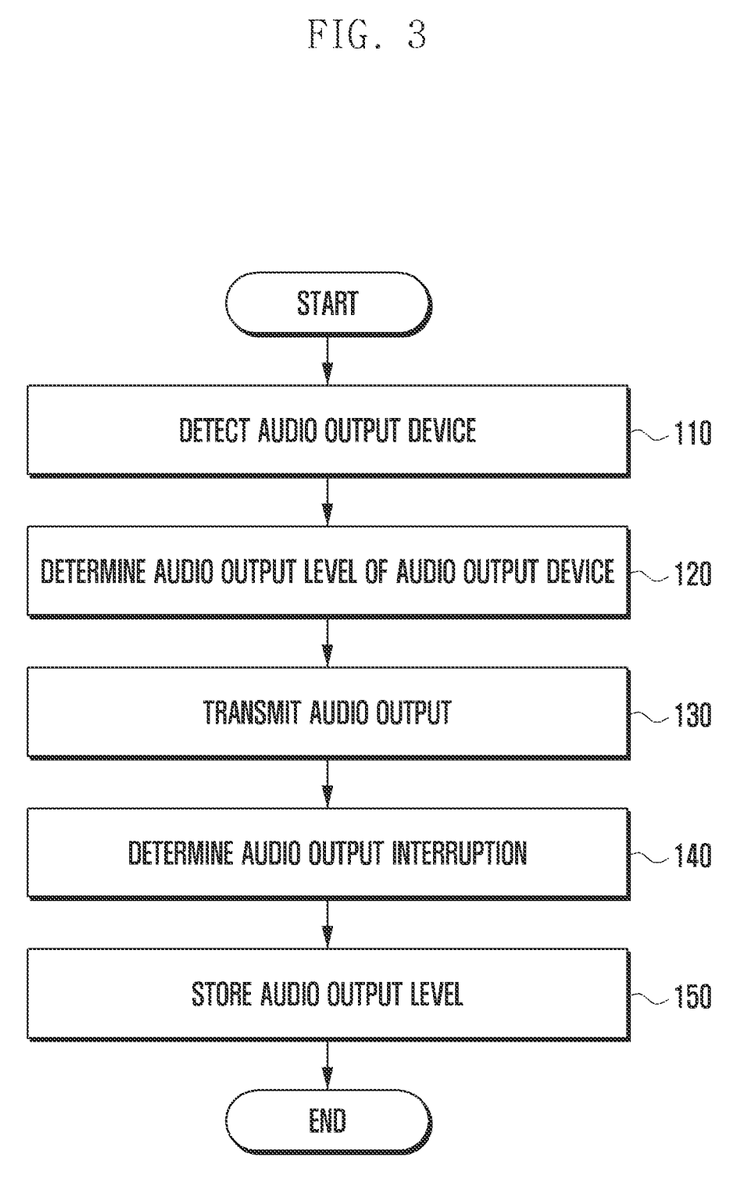
FIG. 3 is a flow chart illustrating a method of controlling an audio output of an electronic device according to an embodiment of the present disclosure.

FIG. 3 is a flow chart illustrating a method of controlling an audio output of an electronic device according to an embodiment of the present disclosure.

Referring to FIG. 3, in operation 110, a controller 10 detects an audio output device 20 configured to output an audio output or sound. The controller 10 can detect the audio output device 20 using any recognition technique. When a recognition unit 30 has recognized a plurality of audio output devices 20 connected with the electronic device, the controller 10 or the recognition unit 30 can determine a type of audio output device 20 in which to output or transmit the audio output from the electronic device. For example, the controller 10 or the recognition unit 30 can determine that the audio output device 20 is a wired or wireless audio output device such as wired earphone, an internal speaker, a BLUETOOTH headset, an external speaker, etc. In an exemplary embodiment, the type of audio output device 20 may be stored in storage unit 40.

It is noted that for clarity and ease of discussion, the exemplary methods of controlling an audio output of an electronic device will be described with respect to a single audio output device 20. However, one of ordinary skill in the art would recognize that the exemplary methods may be performed for each type of audio output device associated with the electronic device. In addition, information associated with the audio output level with respect to a first audio output device may be used in determining an audio output level with respect to a second audio output device.

In operation 120, the controller 10 determines an audio output level of the audio output device 20 detected in operation 110. For example, the controller 10 can determine an audio output level in which to transmit the audio output using the audio output device 20 based on the type of audio output device and/or a predetermined audio output level. The predetermined audio output level can be a previous audio output level or a plurality of previous output levels. The previous audio output levels can be associated with a single type of audio output device 20 or a plurality of different types of audio output devices.

In an exemplary embodiment, the controller 10 determines the audio output level of the detected audio output device 20 as an average value of the plurality of previous audio output levels stored in a storage unit 40 where the audio output levels stored in the storage unit 40 are associated with a single type of audio output device 20. In other words, the controller 10 determines an audio output level in which to transmit the audio output using the audio output device 20 based on an average audio output level associated with a plurality of previous audio output levels stored in the storage unit 40 where the plurality of previous audio output levels correspond to the audio output device 20 selected to transmit the audio output.

In another exemplary embodiment, the controller 10 can determine the audio output level of the detected audio output device to be based on a single audio output level such as the last audio output level in which the audio output was transmitted using the selected audio output device 20 or the initial audio output level in which the audio output was previously transmitted. For example, an audio output may be transmitted by the electronic device using the audio output device 20 at an initial output level of 8 and then modified to an output level to 12 during a previous transmission prior to discontinuing the transmission of the audio output. The initial output level of 8 and/or the modified output level of 12 may be stored at storage unit 40 such that the output levels are associated with the audio output device. When the audio output is selected to resume transmission of the audio output using the audio output device, the controller 10 can select the audio output to be transmitted at an output level 8 or 12 using the audio output device 20.

In operation 130, the audio output device 20 outputs or transmits an audio output or a sound at the determined audio output level.

In operation 140, the audio output is interrupted. The audio output may be interrupted for various reasons. For example, a user can select to discontinue the transmission of the audio output. The audio output device 20 can be disconnected from the electronic device such as manually disconnecting the wired earphones or when the BLUETOOTH headset becomes out of range of the electronic device.

In operation 150, the controller 10 stores an audio output level when an interruption of the audio output is determined. For example, the controller 10 can store the last audio output level in which the audio output was transmitted in the storage unit 40 when the interruption occurs. The audio output level stored in operation 150 may be used to determine an audio output level of the audio output device 20 detected in operation 120 in subsequent iterations of the method illustrated in FIG. 3. That is, when operations 110 to 150 are repeated, a plurality of audio output levels is stored in the storage unit 40 where a previously stored audio output level may be used in the determination of a current audio output level. For example, when the current audio output level is based on an average of a plurality of previously stored audio output levels, the controller 10 selects the number of audio output levels from among the plurality of audio output levels stored in previous operation step 150 and then calculates an average value of the audio output levels at a current operation step 120.

Figure 4:
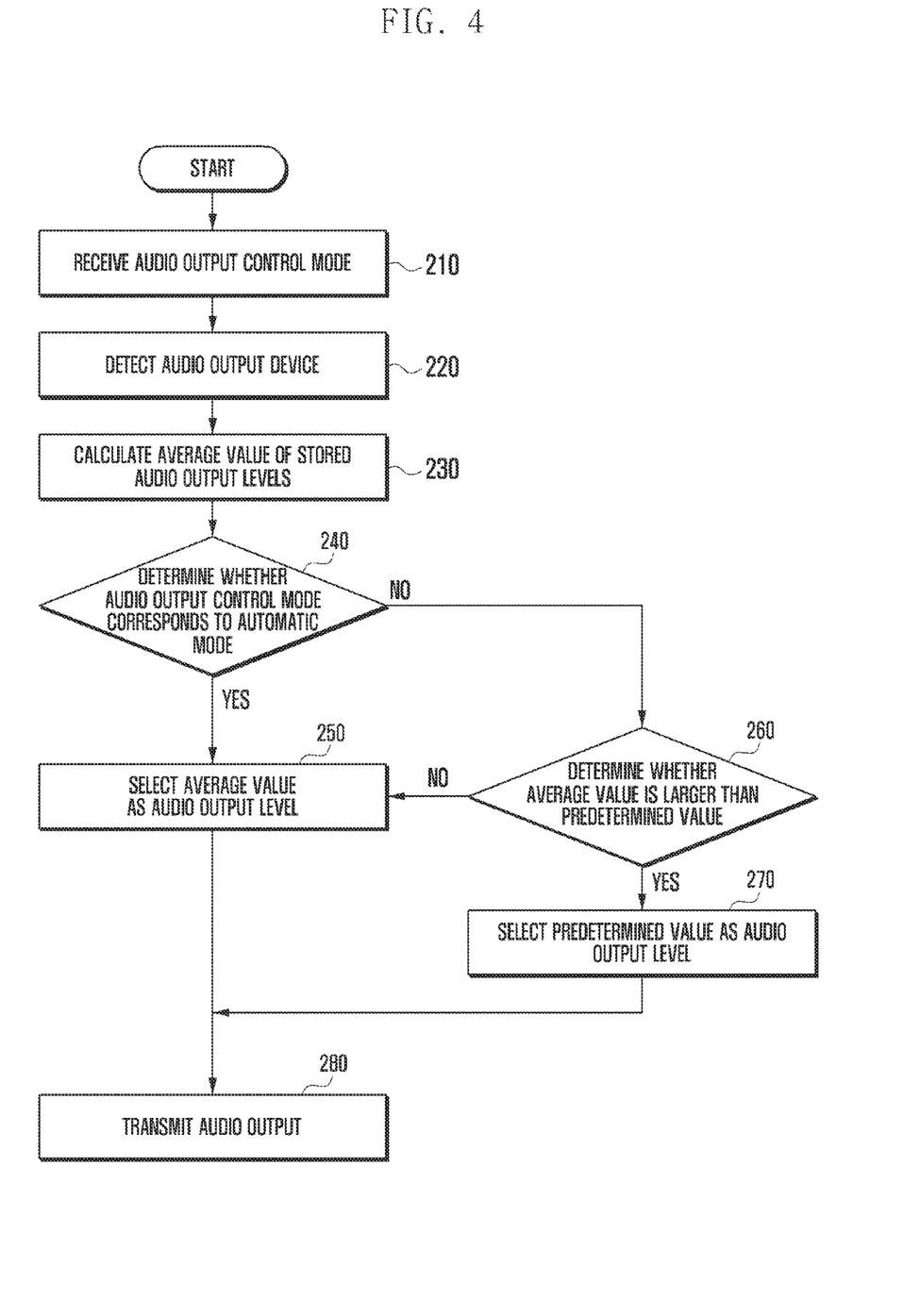
FIG. 4 is a flow chart illustrating a process of determining an audio output level in a method of controlling an audio output of an electronic device according to an embodiment of the present disclosure.

FIG. 4 is a flow chart illustrating an alternative process of determining an audio output level in a method of controlling an audio output of an electronic device according to an embodiment of the present disclosure.

Referring to FIG. 4, in operation 210, an indication associated with a selected audio output control is received. For example, a user may select an audio output control mode through an input unit 50. Controller 10 determines an audio output control mode on the basis of a received user input. The audio output control mode may be a manual mode and an automatic mode. In an exemplary embodiment, the audio output may be transmitted at a predetermined audio output level when in the manual mode (and certain parameters are met) and the audio output may be transmitted at a dynamically determined audio output level when in the automatic mode.

In operation 220, an audio output device 20 is detected. For example, a recognition unit 30 recognizes that the audio output device 20 is connected to the electronic device. The controller 10 or the recognition unit 30 then determines the type of audio output device 20 based on the detected audio output device 20. In addition, an audio output device 20 can be identified in which to transmit the audio output when a plurality of audio output devices 20 is connected to the electronic device. For example, when a plurality of audio output devices 20 is connected to the electronic device, the audio output device 20 identified to transmit the audio output may be based on a user selection or a determination by the controller 10.

In operation 230, an average value of stored audio output levels is calculated. For example, controller 10 may select a predetermined number of audio output levels stored at storage unit 40. The predetermined number of audio output levels may be associated with the same type of audio output device 20 detected at operation 220 or any type of audio output device 20 configured to be connected to the electronic device. Controller 10 then calculates an average value of the predetermined number of audio output levels.

In an exemplary embodiment, the controller 10 may select a number of different audio output level entries (e.g., stored at storage unit 40) to determine the average audio output value. For example, five different audio output level entries may be used to determine the average audio output value. The audio output levels may be selected based on the relationship of the stored audio output level with respect to the transmission time of an audio output. For instance, the audio output values may be selected to correspond with when an audio output was previously initiated (e.g., close to the time in which the audio output started to be transmitted) or when the audio output was previously interrupted (e.g., close to the time in which the audio output was discontinued). In addition, the audio output values may be selected based on the type of audio output device 20 used to transmit the audio output device. It is noted that while five different audio output level entries have been described to be used in determining an average value, any number of audio output level entries may be selected to determine the average audio output value.

In operation 240, a determination is made as to whether the audio output control mode is an automatic control mode. For example, controller 10 determines whether the audio output control mode is an automatic control mode or a manual control mode based on the indication received at operation 210.

In operation 250, the average audio output level value is selected as the audio output level. For example, when the audio output control mode is determined to be an automatic control mode, controller 10 can determine that the audio output level is based on the average audio output level calculated in operation 230. For instance, the audio output level can be selected to be substantially similar to the calculated average audio output level value.

In operation 260, the average audio output level value is compared to a predetermined value. For example, controller 10 compares the average audio output level value calculated in operation 230 to a predetermined threshold output value when the audio output control mode is determined to be a manual control mode.

In an exemplary embodiment, depending on the audio output levels used in calculating the average audio output level value, it may be difficult to identify a pattern of use associated with a user based on the calculated average audio output level value. For example, when the possible output levels range from 0 to 10 and substantially all of the audio output levels used in determining the average are above, for example, an output level of 5, it is difficult to discern a pattern of use at lower output levels because the higher output levels may obscure the pattern due to averaging.

In another exemplary embodiment, the predetermined threshold output value may correspond to the audio output level of the electronic device or an audio output level associated with various types of applications or contents corresponding with the electronic device. For example, the predetermined threshold level may vary based on the type of application (e.g., music player, a video player such as YOUTUBE or the like) or the type of content files (e.g., mp3, avi, mp4, or the like).

In operation 270, the audio output level is determined to be the predetermined value. For example, when the audio output control mode is determined to be manual mode and the average audio output value calculated in operation 230 is greater than a predetermined threshold output value, controller 10 determines to transmit the audio output at the predetermined threshold output value (which is less than the calculated average audio output value). However, when the audio output control mode is determined to be manual mode and the average audio output level value calculated in operation 230 is less than or equal to the predetermined threshold output value, controller 10 selects the average audio output level value at operation 250 in which to transmit the audio output.

In operation 280, an audio output or sound is transmitted from the electronic device. For example, controller 10 can control the audio output device 20 to transmit the audio output at the desired audio output level based on the audio output information (e.g., information associated with the type of audio output device and an audio output level).

Figure 5:
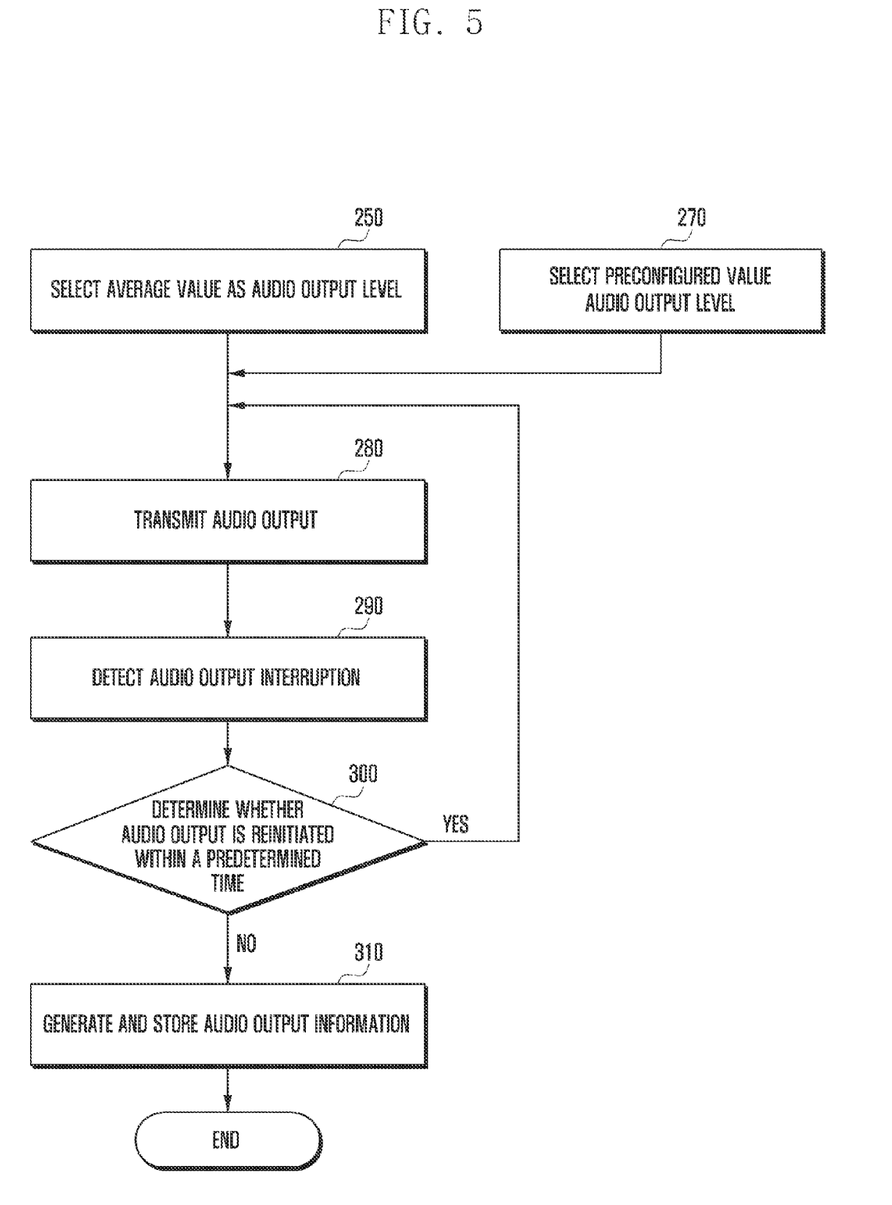
FIG. 5 is a flow chart illustrating a process of generating and storing audio output information in a method of controlling an audio output of an electronic device according to an embodiment of the present disclosure.

FIG. 5 is a flow chart illustrating a process of generating and storing audio output information in a method of controlling an audio output of an electronic device according to an embodiment of the present disclosure.

Referring to FIG. 5, in operation 280, an audio output or sound is transmitted from the electronic device. For example, controller 10 can control the audio output device 20 to transmit the audio output at the desired audio output level. While operations 250 and 270 are illustrated in FIG. 5, one of ordinary skill in the art would recognize that the audio output may be transmitted using any method of determining an audio output level.

In operation 290, an interruption in the audio output is detected. For example, controller 10 can determine that an interruption in the audio output has occurred. An interruption can occur for various reasons such as when a user temporarily interrupts reproduction of the electronic device, when reproduction of the audio file of the electronic device is interrupted, or when an audio output device 20 is disconnected from the electronic device. An interruption may cause the transmission of the audio output from the audio output device 20 to be discontinued.

In operation 300, a determination is made as to whether an audio output is continued within a predetermined time. For example, controller 10 can monitor the time from when the interruption in the transmission of the audio output occurred and compare the elapsed time with a predetermined time period. When the elapsed time is within the predetermined time period, the controller 10 can control the audio output device 20 to resume transmitting the audio output at the last known audio output level prior to the interruption.

In operation 310, audio output information is generated and stored. For example, when controller 10 determines that the elapsed time is outside the predetermined time period, controller 10 can generate the audio output information based on the last known audio output level and the type of audio output device 20 used to transmit the audio output. The generated audio output information is then stored in storage unit 40. The audio output information generated and stored at operation 310 may be used in future methods of determining an audio output level, such as in calculating the average value of the audio output in operation 230.

Figure 6:
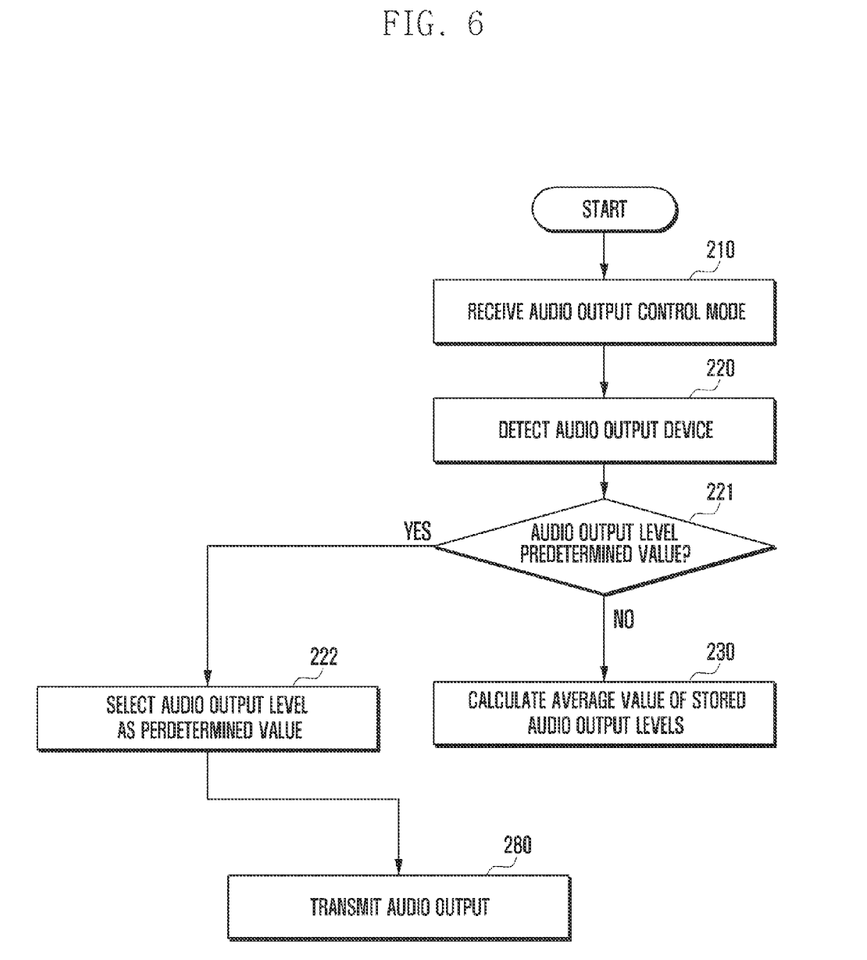
FIG. 6 is a flow chart illustrating a method of controlling an audio output in an initial operation state of an electronic device according to an embodiment of the present disclosure.

FIG. 6 is a flow chart illustrating a method of controlling an audio output of an electronic device according to an embodiment of the present disclosure.

Referring to FIG. 6, it may be difficult to determine the audio output level associated with a pattern of use corresponding to a user based on an audio output level value. For example, when a single audio output level value (e.g., the last known audio output level value or an initial audio output level value) is less than a predetermined threshold level, it may be unknown whether a user desires to continue transmitting the audio output using the same audio output level.

After receiving an indication of the audio output control mode at operation 210 and detecting the audio output device 220, the audio output level can be compared with a predetermined threshold level in operation 221. For example, controller 10 can determine the type of audio output control mode and using the audio output control information, the controller 10 determines an audio output level. The audio output level based on the audio output control information may be compared to the predetermined threshold output level.

In operation 222, the audio output level is determined to be the predetermined value when audio output level associated with the audio output control information is greater than the predetermined value. For example, when controller 10 determines that the audio output level based on the audio output control information is greater than the predetermined threshold output level, the controller 10 selects the audio output level to be the level in which the audio output is transmitted using the audio output device 20.

In operation 230, an average value of stored audio output levels is calculated when the audio output level associated with the audio output control information is less than or equal to the predetermined value. For example, when controller 10 determines that the audio level based on the audio output control information is less than or equal to the predetermined threshold, the controller 10 calculates an average audio output level value based on a plurality of audio output levels stored at storage unit 40. The audio output levels can be associated with the same type of audio output device 20 or different types of audio output devices.

There is no need to limit the number of entries of the audio output information corresponding to the audio output device 20 when determining the average output level value. As the number of entries of the audio output information is used in the average calculation, the average value may undesirably increase thereby obscuring a recent pattern of use associated with a user. When the audio output information used in calculating an average is insufficient, the audio output may be transmitted at an audio output level which is outside a pattern of use associated with the user. Therefore, it may be appropriate to limit the number of the audio output information entries used in calculating the average. For example, a range of 5 to 10 audio output information entries may be used in calculating the average. However, any number of entries may be used.

As described above, according to an audio output control method of an electronic device according to various embodiments of the present disclosure, inconvenience in controlling a volume whenever a sound is reproduced may be minimized and an output of a volume device may be controlled as a volume, which a user wants, by analyzing an audio output level which a user uses.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of controlling an audio output of an electronic device, the method comprising:
   detecting an audio output device connected to the electronic device;
   determining, based on the detecting of the audio output device, a type of the audio output device;
   determining a first audio output level associated with the audio output device, based on the type of the audio output device and a predetermined audio output level, wherein the predetermined audio output level is based on a plurality of previous audio output levels associated with the type of the audio output device; and
   outputting an audio output at the first audio output level using the audio output device,
   wherein the predetermined audio output level is based on an average of a predetermined number of most recently used output levels of the plurality of previous audio output levels associated with the type of the audio output device.

2. The method of claim 1, wherein the first audio output level and the predetermined audio output level are a same audio output level.

3. The method of claim 1, wherein the first audio output level and the predetermined audio output level are different audio output levels.

4. The method of claim 1, wherein the predetermined audio output level comprises a previous audio output level associated with the type of the audio output device.

5. The method of claim 1,
   wherein the determining of the first audio output level comprises determining an average of the plurality of previous audio output levels associated with the type of the audio output device, and
   wherein the first audio output level is the average of the plurality of the previous audio output levels associated with the type of the audio output device.

6. The method of claim 1, wherein the predetermined audio output level is based on a plurality of previous audio output levels associated with each type of audio output device configured to connect to the electronic device.

7. The method of claim 6,
   wherein the determining of the first audio output level comprises determining an average of the plurality of previous audio output levels associated with each type of audio output device configured to connect to the electronic device, and
   wherein the first audio output level is the average of the plurality of the previous audio output levels associated with each type of audio output device.

8. The method of claim 1, further comprising:
   determining an audio output control mode; and
   determining an average of a plurality of previous audio output levels associated with the type of the audio output device,
   wherein the first audio output level is based on the average of the plurality of previous audio output levels associated with the type of the audio output device.

9. The method of claim 8, wherein the first audio output level is the average of the plurality of previous audio output levels associated with the type of the audio output device when the output control mode is determined to be an automatic control mode.

10. The method of claim 8, further comprising:
    comparing the average of the plurality of the previous audio output levels associated with the type of the audio output device to a threshold audio output level when the output control mode is determined to be a manual control mode;
    outputting the audio output at the first audio output level using the audio output device when the average of the plurality of the previous audio output levels is less than the threshold audio output level; and
    outputting the audio output at a second audio output level different from the first audio output level using the audio output device when the average of the plurality of the previous audio output levels is equal to or greater than the threshold audio output level.

11. The method of claim 10, wherein the second audio output level equals the threshold audio output level.

12. The method of claim 1, further comprising:
    detecting a plurality of current audio output levels after the audio output is outputted at the first audio output level using the audio output device; and
    storing each of the plurality of current audio output levels at the electronic device.

13. The method of claim 12, further comprising:
    determining an average of the plurality of current audio output levels after the audio output is outputted at the first audio output level using the audio output device,
    wherein the average of the plurality of current audio output levels is stored as the predetermined audio output level.

14. The method of claim 1, further comprising:
   detecting an interruption in the audio output after the audio output is outputted at the first audio output level using the audio output device;
   determining a current output level associated with the audio output after the interruption is detected; and
   storing the current output level determined after the interruption is detected.

15. The method of claim 14, wherein the predetermined audio output level is based on the current output level determined after the interruption is detected.

16. An electronic device for transmitting an audio output to an audio output device from among a plurality of audio output devices, the electronic device comprising:
   an input device configured to receive a selection associated with an audio output control mode;
   a recognition unit configured to:
   detect an audio output device connected to the electronic device, and
   determine a type of the audio output device based on the detecting of the audio output device,
   wherein the audio output device detected by the recognition unit is configured to transmit the audio output from among a plurality of audio output devices;
   at least one processor configured to:
   generate first audio output information, based on the type of the detected audio output device and a predetermined audio output level, and
   control the detected audio output device to transmit the audio output based on the generated audio output information; and
   a storage device configured to store the first audio output information,
   wherein the predetermined audio output level is based on a plurality of previous audio output levels associated with the type of the audio output device,
   wherein the at least one processor is further configured to determine an average audio output value based on the plurality of previous audio output levels associated with the detected audio output device, and
   wherein the at least one processor is further configured to determine the average audio output value based on an average of a predetermined number of most recently used audio output levels of the plurality of previous audio output levels associated with the detected audio output device.

17. The electronic device of claim 16,
   wherein the at least one processor controls the detected audio output device based on the average audio output value.

18. The electronic device of claim 17,
   wherein the at least one processor is further configured to:
   determine an occurrence of an interruption in the transmission of the audio output at the electronic device, and
   generate second audio output information after the occurrence of the interruption, and
   wherein the second audio output information is stored at the storage unit separate from the first audio output information.

* * * * *